United States Patent [19]
Wirth et al.

[11] Patent Number: 5,451,878
[45] Date of Patent: Sep. 19, 1995

[54] NON-RESONANT GRADIENT FIELD ACCELERATOR

[75] Inventors: William F. Wirth, Sullivan; Thomas G. McFarland, Hartland, both of Wis.

[73] Assignee: General Electric Company, Milwaukee, Wis.

[21] Appl. No.: 276,149

[22] Filed: Jul. 15, 1994

[51] Int. Cl.6 .................................... G01R 33/28
[52] U.S. Cl. ............................... 324/322; 324/318
[58] Field of Search ............... 324/322, 318, 300, 314

[56] References Cited

U.S. PATENT DOCUMENTS

| | | | |
|---|---|---|---|
| 4,628,264 | 12/1986 | Rzedziam | 324/318 |
| 4,733,342 | 3/1988 | Mueller et al. | 324/322 |
| 5,017,871 | 5/1991 | Mueller et al. | 324/318 |
| 5,063,349 | 11/1991 | Roemer et al. | 324/322 |
| 5,105,153 | 4/1992 | Mueller et al. | 324/322 |
| 5,245,287 | 9/1993 | Nowak | 324/322 |
| 5,270,657 | 12/1993 | Wirth et al. | 324/318 |
| 5,285,161 | 2/1994 | Rzedzian et al. | 324/322 |
| 5,298,863 | 3/1994 | Nowak et al. | 324/322 |
| 5,311,136 | 5/1994 | Takahashi | 324/322 |

*Primary Examiner*—Sandra L. O'Shea
*Assistant Examiner*—Raymond Y. Mah
*Attorney, Agent, or Firm*—Quarles & Brady

[57] ABSTRACT

A gradient amplifier for an MRI system includes a low voltage amplifier and high voltage amplifier connected in series circuit with a gradient coil. A gradient current command pulse causes the low voltage amplifier to produce the desired coil current and the same command is differentiated to provide a voltage command for the high voltage amplifier which causes it to deliver power to rapidly build the gradient field at the beginning of the pulse and to remove power at the conclusion of the pulse. Two embodiments disclose different strategies for maintaining the high voltage power supply fully charged throughout a scan.

9 Claims, 3 Drawing Sheets

NON-RESONANT GRADIENT FIELD ACCELERATOR

BACKGROUND OF THE INVENTION

The field of the invention is nuclear magnetic resonance imaging methods and systems. More particularly, the invention relates to the generation of magnetic field gradients for use in fast pulse sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes.

For example, the concept of acquiring NMR image data in a short time period has been known since 1977 when the echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and there has been a long felt need for apparatus and methods which will enable EPI to be practiced in a clinical setting.

One of the main limitations in applying the EPI pulse sequence and other fast pulse sequences in a clinical setting is the inability of commercially available MRI systems to produce the required magnetic field gradient pulses. Fast pulse sequences require very short duration magnetic field gradient pulses which in turn require a very high risetime in the gradient coil current. Methods used to achieve higher current risetime include reducing gradient coil inductance by employing small local coils, and increasing gradient amplifier voltage and power. The latter solution requires an increase in voltage of ten times and results in a proportional increase in gradient amplifier cost.

A number of methods have been used to increase gradient amplifier voltage without proportionally driving up its cost. In one scheme this has been accomplished with the addition of charged capacitors and switching networks to the existing amplifiers that resonate the coil inductance and rapidly move the coil current to the desired level. Sinusoidal pulses or "trapezoids" with sinusoidal transitions may be generated with this technique. Another technique uses a much larger charged capacitor inside of a full bridge switching network to apply an almost constant voltage to the coil to generate fast ramps and freewheel the current during the flat portion of the trapezoid. In both of these methods the circuitry is partitioned such that the existing gradient amplifiers supply the electrical losses of the system while the added high voltage circuitry supplies the reactive power to the coil inductance which is recovered back into the capacitor at the end of each current pulse. Each technique requires some method of managing the energy flow so the capacitor voltage starts each pulse at a controlled level.

Both of the above techniques impose undesirable waveform restrictions on the gradient pulse shape because the voltage on the coil is determined by the capacitor. It is the object of this invention to remove these restrictions while retaining the benefits of dual power amplifiers, one optimized for supplying low voltage losses and the other optimized for supplying the high voltage reactive power.

SUMMARY OF THE INVENTION

The present invention is a gradient amplifier for supplying current to a gradient coil in an MRI system. More specifically, the invention includes a low voltage amplifier which is connected in a series circuit with the gradient coil and which is responsive to a gradient current command to produce a voltage which causes the commanded current I to flow in the gradient coil under steady-state conditions, a high voltage amplifier connected in the series circuit with the gradient coil and being responsive to a voltage command to produce a voltage in the series circuit; and a differentiator circuit connected to receive the gradient current command and produce the voltage command which is proportional to the rate of change of the gradient current command. The high voltage amplifier is an invertor which drives a filter network and the voltage output is controlled by pulse width modulating the invertor in response to the voltage command.

A general object of the invention is to provide high voltage to the gradient coil during transitions between steady-state current levels in a cost effective manner. The high voltage supply comes into play only during changes in the gradient current. As a result, a pulse width modulated invertor may be used to supply the high voltage and lower cost switch devices may be employed in the invertor to control high voltage.

Yet another object of the invention is to accurately produce the commanded gradient current waveform. The low voltage amplifier responds to the gradient current command to produce a current waveform which is highly accurate during the steady-state intervals during which NMR data is acquired.

DESCRIPTION OF THE PROFFERED EMBODIMENT

Figure 1:
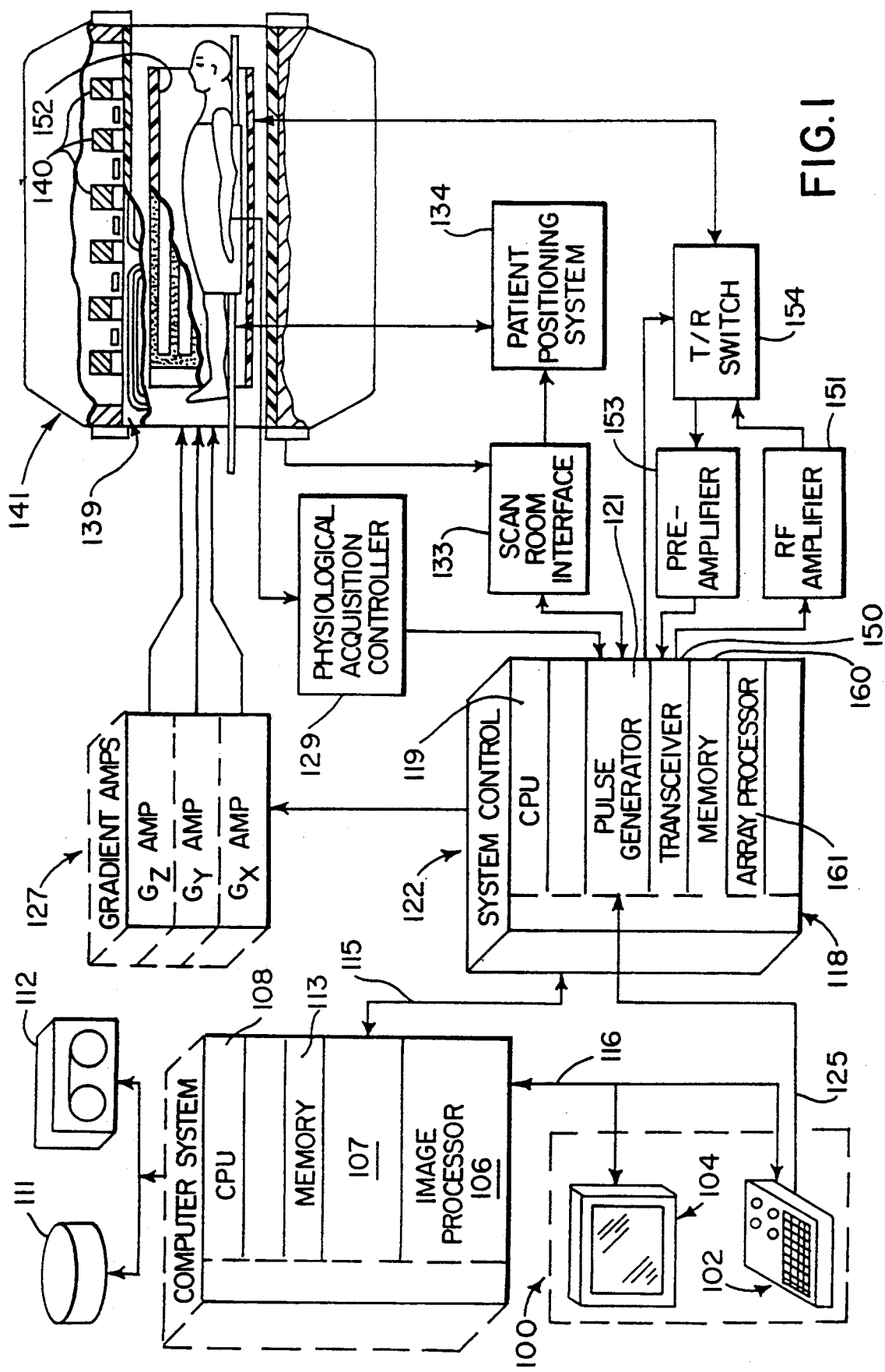
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The three gradient amplifiers are the same in the preferred embodiment, and a detailed description of their construction and operation is provided below with reference to FIGS. 2 and 3.

The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 2:
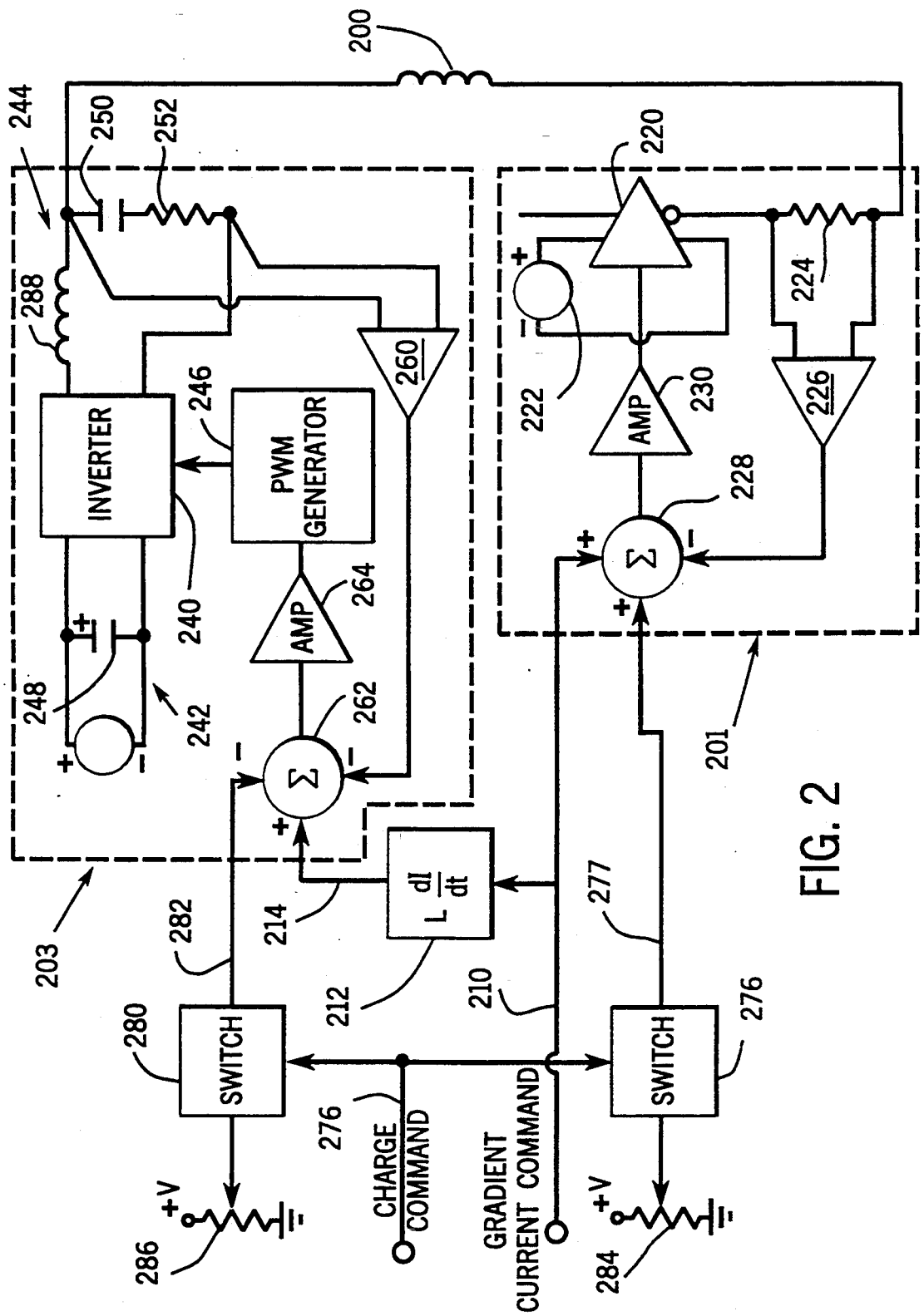
FIG. 2 is an electrical block diagram of a first preferred embodiment of the gradient amplifier which forms part of the MRI system of FIG. 1.

Referring particularly to FIGS. 1 and 2, the three gradient amplifiers 127 each drive a separate gradient coil to produce the three gradient fields $G_x$, $G_y$ and $G_z$. One of these gradient coils is shown in FIG. 2 at 200, and is characterized by an inductance L and a dc resistance R. The gradient coil 200 is connected in a series circuit with a low voltage amplifier indicated by dashed lines 201, and a high voltage amplifier indicated by dashed lines 203. The voltage applied to the gradient coil 200 is thus the sum of the voltages produced by the amplifiers 201 and 203, and the resulting current is determined primarily by this voltage and the reactive component L and the resistive component R of the coil 200.

As indicated above, the pulse generator module 121 produces a gradient current command-in the form of a waveform. This gradient current command is received on the control line 210 and applied directly to the low voltage amplifier 201. As will be explained in detail below, the low voltage amplifier 201 is responsive to this gradient current command to produce a voltage in the series circuit that will cause the commanded current to flow through the gradient coil 200. However, due to the inductance L of the gradient coil 200, this current will not "track" the commanded current waveform during sharp transitions in current. It is the purpose of the high voltage amplifier 203 to compensate for this current lag by supplying high voltage to the series circuit during current transitions, and to thereby promptly transfer reactive energy to or from the gradient coil's field.

To this end, a differentiator circuit 212 connects to receive the gradient current command on line 210 and produce a voltage command on line 214 which is applied to the input of the high voltage amplifier 203. The voltage command is proportional to the product of the gradient coil inductance (L) and the rate of change of commanded gradient current (dI/dt), and is of course, maximum during the leading and trailing edges of the commanded gradient current pulse. As will be described below, the high voltage amplifier produces a voltage in the series circuit that is proportional to this voltage command.

Referring still to FIG. 2, the low voltage amplifier 201 is constructed around a power amplifier 220 which connects to a low voltage dc power supply 222. The power amplifier 220 forms part of a closed loop system in which the current flowing in the series circuit is sensed by a resister 224 and fed back through an amplifier 226 to a summing point 228 where it is subtracted from the gradient current command on line 210. The difference, or error signal, is 10 amplified at 230 and applied to control the voltage output by the amplifier 220. The amplifier 220 thus applies voltage to the gradient coil 200 which causes the commanded current to flow.

The high voltage amplifier 203 is formed around a full bridge invertor 240 which couples a high voltage dc source 242 to an LRC filter 244. A pulse width modulation generator 246 controls the conductivity of four semiconductor switches (not shown) in the invertor 240 so that the high dc bus voltage across capacitor 248 is switched on and off in the time ratio that supplies the desired average voltage across capacitor 250 and resistor 252 in the LRC filter 244. An invertor such as that described at page 183 in *Principles of Power Electronics*, published in 1991 by Addison-Wesley and authored by J. G. Kassakian, M. F. Schlecht and G. C. Verghese operating at a carrier frequency of 31 kHz is preferred. A PWM generator 246 such as that described in the same publication at page 185 is preferred.

The invertor 240 and PWM generator 246 form part of a closed loop system in which the voltage produced across capacitor 250 and resistor 252 in the series circuit is fed back through an amplifier 260 to a summing point 262. The feedback voltage subtracts from the voltage command on line 214 and the difference signal is applied through amplifier 264 to the input of PWM generator 246. The PWM generator 246 controls the firing of the four semiconductor switches in the invertor 240 to apply the proper net voltage to the LRC filter 244. At the beginning of a gradient current command pulse the voltage command (LdI/dt) is a large positive value and the invertor 240 is controlled to apply the high voltage source 242 to the series circuit containing the gradient coil 200. This quickly boosts gradient coil current by supplying the reactive power to the coil's field. As the magnetic field and the gradient coil current reach the commanded level, the voltage command (LdI/dt) decreases to zero and the invertor 240 turns off to disconnect the high voltage source 242.

On the trailing edge of the gradient current command pulse the reactive power stored in the gradient coil's field is quickly coupled to the high voltage capacitor 248 by the invertor 240. The trailing edge of the gradient current command pulse produces a highly negative voltage command (−LdI/dt) which causes the invertor 240 to apply the voltage across capacitor 250 and resistor 252 to the capacitor 248. The reactive power supplied by the high voltage source 242 during the rise in gradient current is thus substantially returned during the fall in gradient current, and the current in the series circuit quickly drops to the commanded level.

To boost the gradient coil current to the commanded value, energy equal to $0.5LI^2$ is drawn from the high voltage supply capacitor 248 to charge the inductance (L) of the gradient coil 200. This reduces the capacitor voltage slightly. In most MRI pulse sequences the gradient current is then held in a constant, steady-state, level for a period of time before returning to zero. When the gradient current is driven back to zero, energy equal to $0.5LI^2$ is transferred back into the capacitor 248 and in a lossless system, the capacitor voltage would be charged back to its starting voltage. However, energy losses cause a slight decrease in capacitor voltage as it is repeatedly discharged and recharged during the MRI scan sequence.

In the first preferred embodiment of the invention this energy "short fall" is supplied from the low voltage power supply 222 through the operation of the low-voltage amplifier 201 and high voltage amplifier 203. More specifically, during portions of the MRI pulse sequence when low gradient fields do not affect the NMR physics, a charge command is produced by the pulse generator 121 on the control line 275. This command operates switch 276 which applies a current command on line 277 to the low voltage amplifier 201, and it operates a switch 280 which applies a voltage command on line 282 to the high voltage amplifier 203. The current command is set by potentiometer 284 to provide enough current in the series circuit over the duration of the charge command to replenish the lost charge on the high voltage capacitor 248. The voltage command is set by potentiometer 286 to regulate a voltage that opposes the flow of recharging current produced by the low voltage amplifier 201. The invertor 240 and inductor 288 form a boost regulator whose operation is well know in the art. This boost regulator transfers energy stored in the filter capacitor 250 by closing a power switch to "charge" the magnetic field of inductor 288 with current and then opening this switch and allowing the current to flow into the high voltage capacitor 248. The charge on the capacitor 248 is thus maintained throughout the scan to keep the high voltage at a relatively constant value.

Figure 3:
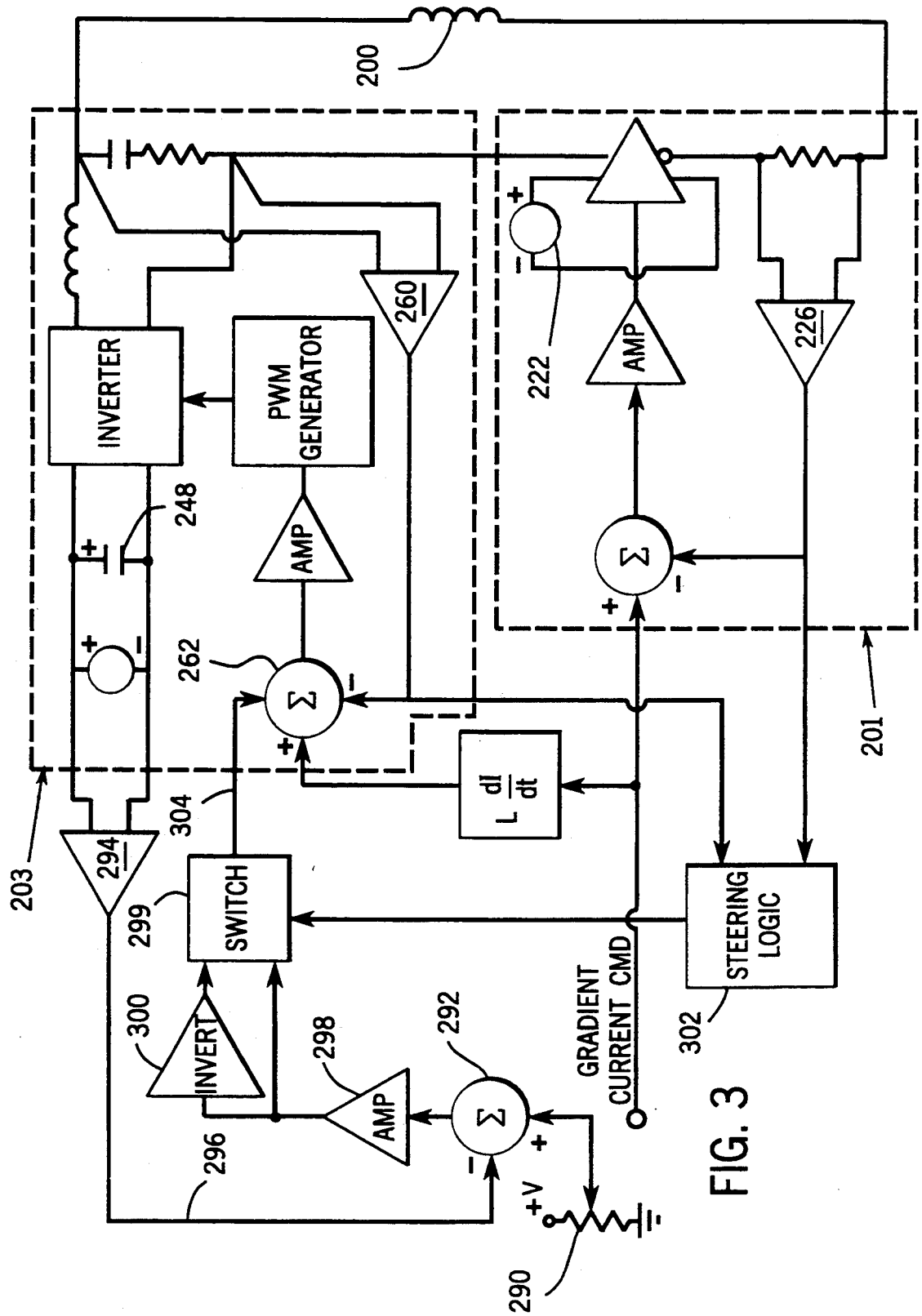
FIG. 3 is an electrical block diagram of a second preferred embodiment of the gradient amplifier.

Referring particularly to FIG. 3, the second preferred embodiment of the present invention includes a low voltage amplifier 201 and a high voltage amplifier 203 which are essentially identical to those described above. The primary difference between the two embodiments is the methods and means for recharging the high voltage capacitor 248 during the scan. More specifically, a charge reference command is produced by a potentiometer 290 and applied to a summing circuit 292. The voltage across the high voltage capacitor 248 is fed back through amplifier 294 to form a voltage feedback signal on line 296 which is subtracted by the summing circuit 292 to form a voltage error signal. The voltage error signal is applied through an amplifier 298 directly to one input of an analog switch 299, and indirectly to another switch input through an invertor 300. Steering logic 302 controls the switch 299 and thereby determines whether the voltage error signal or its inversion is applied through control line 304 to the summing circuit 262 in the high voltage amplifier.

The steering logic 302 receives the current feedback signal from amplifier 226 and voltage feedback signal from amplifier 260, and from these determines the direction of power flow, into or out of, the capacitor 248. The steering logic 302 operates the switch 299 such that the voltage error signal reduces the charge flowing out of the high voltage capacitor 248 when the high voltage power supply 203 is furnishing current to the gradient coil 200, and increases the charge flowing into the capacitor 248 during the recharge phase of circuit operation. As with the first embodiment, the current necessary to maintain a constant charge on the circuit 248 through the scan is drawn from the low voltage power supply 222.

We claim:

1. A gradient amplifier for providing current to a gradient coil in an NMR system in response to a gradient current command, the combination comprising:

a low voltage amplifier connected in a series circuit with the gradient coil and having an input for receiving the gradient current command, said low voltage amplifier being operable to produce a voltage which causes the commanded current to flow in the series circuit;

a high voltage amplifier connected in the series circuit with the gradient coil and having an input for receiving a voltage command, said high voltage amplifier being operable in response to the voltage command to produce a voltage in the series circuit; and a differentiator circuit connected to receive the gradient current command and produce the voltage command which is proportional to the rate of change of the gradient current command.

2. The gradient amplifier as recited in claim 1 in which the high voltage amplifier includes an invertor which couples a high voltage source to the series circuit, and the operation of the invertor is controlled by a pulse width modulator generator that is responsive to the voltage command.

3. The gradient amplifier as recited in claim 2 which includes:

means for producing a voltage feedback signal indicative of the voltage produced in the series circuit by the high voltage amplifier; and a summing circuit for producing a voltage error signal from the voltage command and the voltage feedback signal, the voltage error signal being coupled to the pulse width modulator generator.

4. The gradient amplifier as recited in claim 2 in which the invertor connects to the series circuit through a filter which includes a capacitor connected in the series circuit.

5. The gradient amplifier as recited in claim 1 in which the low voltage amplifier includes:

means for producing a current feedback signal indicative of the current produced in the series circuit;

a summing circuit for producing a current error signal from the gradient current command and current feedback signal; and an amplifier for receiving the current error signal and producing said voltage which causes the commanded current to flow in the series circuit.

6. The gradient amplifier as recited in claim 1 in which the high voltage amplifier includes:

a high voltage source having a high voltage capacitor;

an invertor connected between the high voltage source and the series circuit; and means for controlling the invertor in response to the voltage command to either deliver power from the high voltage source to the series circuit, or to remove power from the series circuit and deliver it back to the high voltage source.

7. The gradient amplifier as recited in claim 6 which includes charge command means for producing a charge signal; and the high voltage amplifier includes means for summing the charge signal with the voltage command to alter the power delivered by the invertor between the high voltage source and the series circuit such that the high voltage capacitor maintains a substantially constant average charge during a scan in which a plurality of gradient current commands are received.

8. The gradient amplifier as recited in claim 7 in which the charge signal is also coupled to the low voltage amplifier and summed with the gradient current command to alter the current produced in the series circuit by the low voltage amplifier.

9. The gradient amplifier as recited in claim 7 in which the charge command means includes a voltage feedback circuit connected to the high voltage source and producing a feedback signal indicative of the magnitude of the high voltage; and means for summing the feedback signal with a charge reference command to produce said charge signal.

* * * * *